US006743294B2

(12) United States Patent
Pandelisev

(10) Patent No.: US 6,743,294 B2
(45) Date of Patent: *Jun. 1, 2004

(54) CONTINUOUS CRYSTAL PLATE GROWTH PROCESS AND APPARATUS

(75) Inventor: Kiril A. Pandelisev, Mesa, AZ (US)

(73) Assignee: Optoscint, Inc., Tempe, AZ (US)

( * ) Notice: Subject to any disclaimer, the term of this patent is extended or adjusted under 35 U.S.C. 154(b) by 138 days.

This patent is subject to a terminal disclaimer.

(21) Appl. No.: 10/011,762

(22) Filed: Dec. 11, 2001

(65) Prior Publication Data
US 2002/0040675 A1 Apr. 11, 2002

Related U.S. Application Data

(62) Division of application No. 09/640,745, filed on Aug. 18, 2000, now Pat. No. 6,334,899, which is a division of application No. 09/504,961, filed on Feb. 16, 2000, now Pat. No. 6,153,011, which is a division of application No. 09/234,411, filed on Jan. 21, 1999, now Pat. No. 6,071,339, which is a division of application No. 08/490,893, filed on Jun. 16, 1995, now Pat. No. 5,993,540.

(51) Int. Cl.[7] .............................................. C30B 11/04

(52) U.S. Cl. ................. 117/204; 117/4; 117/6; 117/7; 117/8; 117/9; 117/204; 117/205

(58) Field of Search ................. 117/4, 8, 6, 7, 117/9, 204, 205

(56) References Cited

U.S. PATENT DOCUMENTS

RE30,412 E * 10/1980 Raychaudhuri ............. 136/255
5,628,841 A * 5/1997 Inoue et al. ................ 148/310
5,993,540 A * 11/1999 Pandelisev ................... 117/26

* cited by examiner

Primary Examiner—Robert Kunemund
(74) Attorney, Agent, or Firm—James Creighton Wray; Meera P. Narasimhan

(57) ABSTRACT

Reactive gas is released through a crystal source material or melt to react with impurities and carry the impurities away as gaseous products or as precipitates or in light or heavy form. The gaseous products are removed by vacuum and the heavy products fall to the bottom of the melt. Light products rise to the top of the melt. After purifying, dopants are added to the melt. The melt moves away from the heater and the crystal is formed. Subsequent heating zones re-melt and refine the crystal, and a dopant is added in a final heating zone. The crystal is divided, and divided portions of the crystal are re-heated for heat treating and annealing.

28 Claims, 7 Drawing Sheets

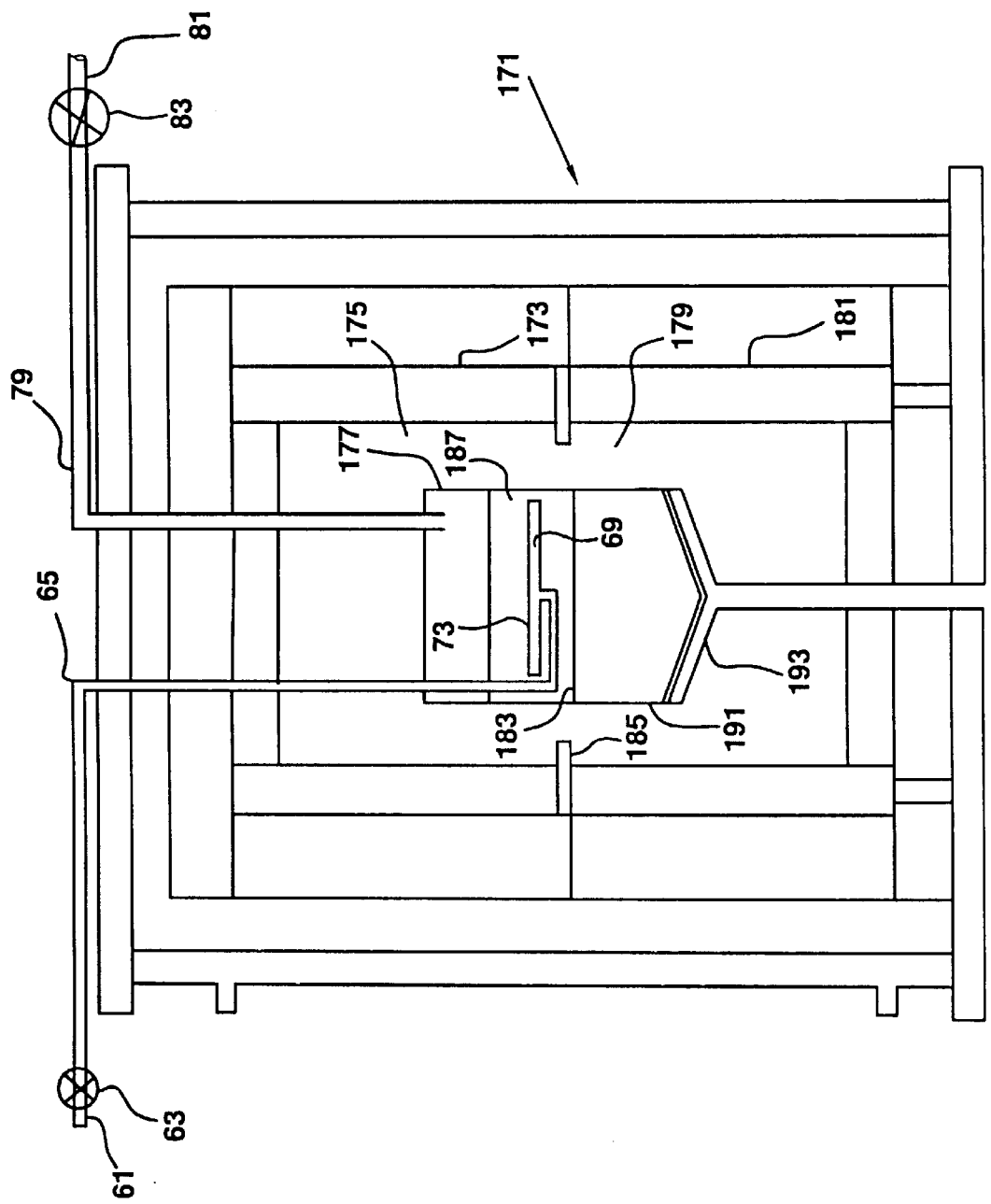

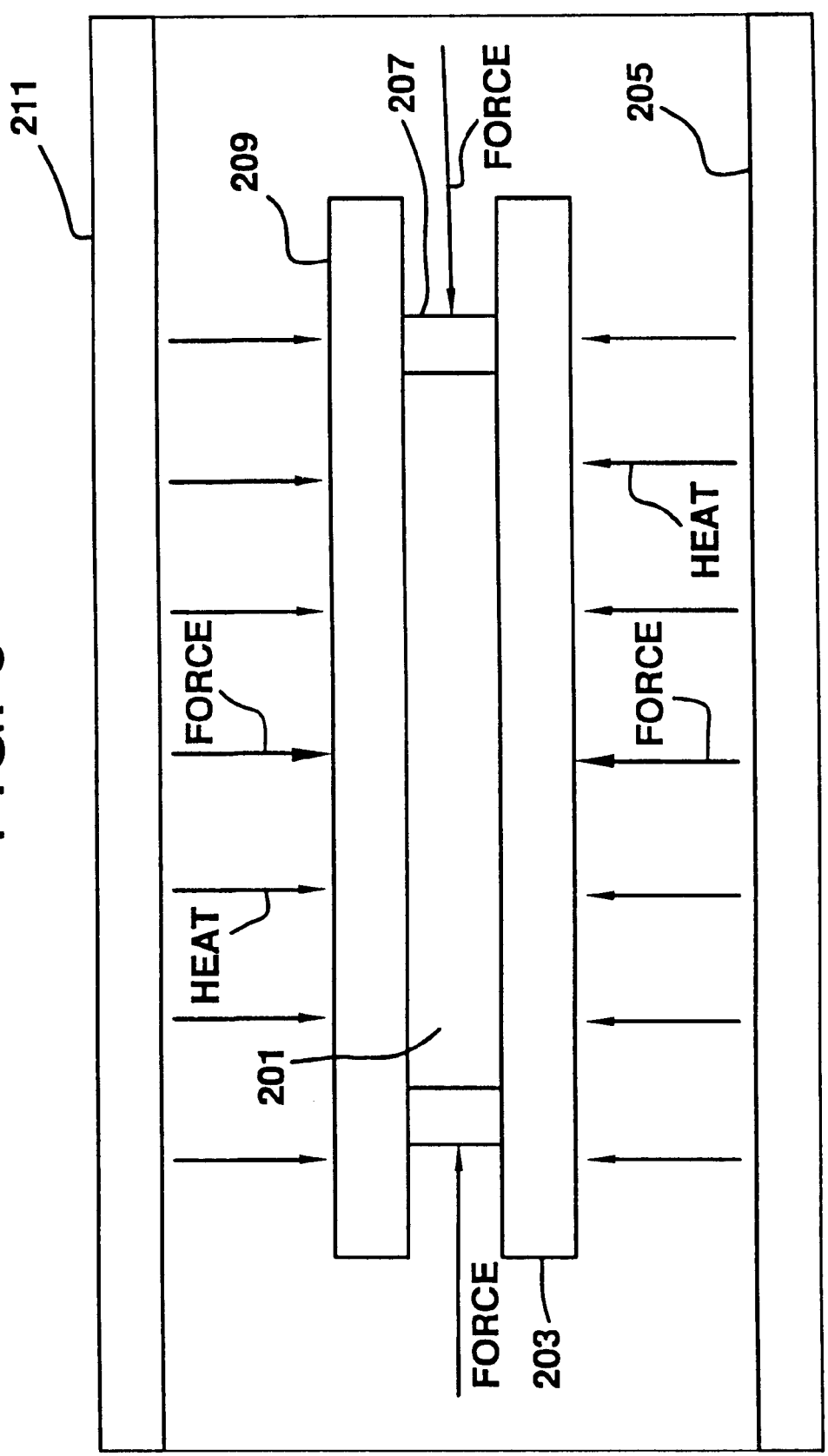

CONTINUOUS CRYSTAL PLATE GROWTH PROCESS AND APPARATUS

This application is a division of application Ser. No. 09/640,745 filed Aug. 18, 2000 U.S. Pat. No. 6,334,899, which is a division of application Ser. No. 09/504,961 filed Feb. 16, 2000, now U.S. Pat. No. 6,153,011, which is a division of application Ser. No. 09/234,411 filed Jan. 21, 1999, now U.S. Pat. No. 6,071,339, which is a division of application Ser. No. 08/490,893 filed Jun. 16, 1995, now U.S. Pat. No. 5,993,540.

BACKGROUND OF THE INVENTION

This invention relates to the purifying of crystal material, the doping of the material and the growth of crystals.

Bridgeman, Bridgeman-Stockbarger, Czochralski and variations have been used for crystal growth. Depending on the crystal growth method, the crystal type and the crystal size, one has to overcome sets of problems. This invention relates to the purification of the crystal material and the crystal growth process itself.

Crystal size and the quality of the crystal starting material play important roles in the production of scintillation crystals. The starting material labeled "scintillation grade" is of five 9's purity 0.9999%. Often the starting material has poor stoichiometry ratio. Growing crystals in a closed type system that have large diameters and up to over 2000 pounds in weight result in crystals that have poor crystal quality. Crystal purity, dopant distribution, defect density and distribution and built-in stress imposed on the crystal during the crystal growth process and the crucible removal may be at unacceptable levels. With the exception of small crystal portions grown at the beginning of the crystal growth, crystals may have lower purity than the starting material. Dopant concentration varies dramatically. That in turn creates uneven light output and decreases the energy resolution of scintillation crystals. When handling large size crystals during the hot transfer, the crystals release large portions of iodine and thallium iodine vapors. Exposure to ambient temperature creates various defects and defect densities in the hot crystals.

The current practices where large barrel-shaped crystals are grown for all applications, regardless of the fact that most applications use rectangular shapes, makes the yields rather low. Scaling up crystal plate sizes from 0.5–1 inch thick slabs cut perpendicular to the crystal length of a barrel-shaped crystal requires large financial investments. At the same time increasing slab geometry increases the crystal production cost by decreasing the growth rate and lowers the crystal quality and yield.

Existing purification methods include supplying a gaseous medium to a surface of a melt carried in a crucible. Those methods require extended times for purification, up in the range of 96 hours. Those methods also ineffectively cure the melt, as lower portions of the melt are never purified.

During melt purification, impurities react with the gas molecules and exit the melt in a gaseous phase. Some impurities react and precipitate from the melt as a sludge. Other reacted impurities float to the surface.

Needs exist for purification systems that remove impurities faster and more efficiently.

These problems and many more remain in the present practices. Needs exist for new approaches for crystal material purification and the crystal growth processes.

Purifying of crystals by reactant gas contact in current systems results in delays and adds significant times to the crystal growth process.

SUMMARY OF THE INVENTION

Reactive gas is released through a crystal source material or melt to react with impurities and carry the impurities away as gaseous products or as precipitates or in light or heavy form. The gaseous products are removed by vacuum and the heavy products fall to the bottom of the melt. Light products rise to the top of the melt. After purifying, dopants are added to the melt. The melt moves away from the heater and the crystals formed. Subsequent heating zones re-melt and refine the crystal, and a dopant is added in a final heating zone. The crystal is divided, and divided portions of the crystal are re-heated under pressure for heat treating and annealing.

The invention provides multi zone plate crystal growth and purifying.

The new continuous feed multi-zone crystal grower is capable of growing crystals with very large dimensions under reactive atmospheres. The invention produces high purity crystals with very uniform doping concentrations regardless of the crystal size. The dopant level and the residual impurities are controlled in situ within the crystal feed chamber and during the crystal growth process. Crystal applications include nuclear medicine, high energy physics, optics and others where economical production of high purity and large size crystals are required.

The invention provides horizontal (or inclined under some angle) continuous crystal growth process for plates of any dimensions.

Reactive gas permeates start-up material, crystal powder or polycrystalline material or a crystal melt.

Stoichiometry control or "repair" of start-up material is achieved using the present invention.

Multi-zone traveling, stationary immersed and non-immersed heaters, resistive and RF heating elements, or other type heaters are used. This allows controlled gradient crystal growth of any size crystals.

A traveling crucible or crystal slab can be used if the heaters are stationary.

The present invention can be attached as a module to heaters for in situ purification and dopant control.

Dopant concentration control can be achieved by adding dopant in solid or gaseous form. If excess dopant has to be controlled, the excess is either neutralized via chemical reaction or by dilution with pure melt.

For very high purity crystals or crystals with very large sizes, residual impurities control can be achieved by removing the melt from one of the molten zones via vacuum suction and melt draining.

High temperature and high pressure annealing of the plates in final sizes enhances the crystal quality properties.

The invention eliminates cutting of at least one dimension of the crystal before further processing.

A preferred continuous crystal plate growth apparatus has a source of starter material. A valve supplies material from the starter material source. A first, hot zone communicates with the valve for heating the material. A dopant source and a dopant controller are connected to the hot zone for supplying dopant into the material in the hot zone. A second reduced heat zone beyond the hot zone reduces heat in the material, which forms a solid plate. A receiver receives the solid plate from the second, reduced heat zone and advances the solid plate. A lowered temperature heating zone adjacent the receiver lowers temperature of the solid crystal plate on the receiver. An enclosure encloses the zones and the solid crystal plate in a controlled gaseous environment.

A large heater overlies the small heater. The large heater has first and second zones, and the small heater has the first hot and second reduced heat zones. Baffles separate the first and second zones of the heaters.

The first zone of the small heater produces a crystal melt temperature higher than a crystal melting temperature in the material. The second zone of the small heater produces a temperature lower than the melting temperature. The temperature in the material at the small heater baffle is about the melting temperature. The large heater first zone provides heat below the melting temperature, and the large heater second zone provides a lower heat.

Preferably the receiver is a conveyor which moves at a speed equal to a crystal growth rate.

A second source of starter material and a second valve are connected to the hot zone for flowing material from the second source to the hot zone.

The crystal melt or starter material is purified in a chamber having a bottom and sides. A lid covers the chamber. An opening introduces liquid or solid material into the chamber. An outlet near the bottom of the chamber releases crystal melt or starter material from the chamber. A shut-off valve opens and closes the outlet. A source of reactive gas is connected to the chamber and extends into a bottom of the chamber. A reactive gas release barrier near the bottom of the chamber slowly releases reactive gas into the crystal starter material. A gas space is located at the top of the chamber above the crystal melt or starter material. An exhaust line is connected to the space at the top of the chamber for withdrawing gas from the top of the chamber. A heater adjacent the chamber heats the chamber and the crystal melt or starter material within the chamber.

The heater has heating elements around sides of the chamber and along the walls of the chamber.

The shut-off valve is a thermally activated or a mechanical or electromechanical valve.

An inlet conduit is connected to the lid. A source of reactive liquid or solid is connected to the inlet conduit. A valve is connected between the source of reactive liquid or solid. A plug is connected to the conduit for plugging the conduit after adding reactive liquid or solid to the chamber.

Preferably a vacuum pump is connected to the exhaust line. A preferred barrier is a porous plate.

In one heating and purifying embodiment, a chamber has an inlet and an outlet. A purified material discharge is connected to the outlet. An enclosure has side walls, a bottom and a top. A reactive gas source is connected to a gas inlet tube. A gas distributor is mounted in the chamber near the bottom. A gas releasing plate connected to the gas distributor releases the reactive gas from the inlet tube and the distributor into the material in the feeding and purifying chamber. A heater heats material in the chamber. A gas exhaust exhausts gas from an upper portion of the chamber.

A preferred casing has a cover and side walls, and the casing side walls include the chamber side walls.

In one embodiment, an upper heater has heating elements across a top of the chamber.

The apparatus moves with respect to a stationary base for supporting a growing crystal.

Preferred crystal growth embodiments have a support for supporting a growing crystal. A first zone heater adjacent the growing crystal heat and liquefies the growing crystal. A second zone heater spaced from the first zone heater along the growing crystal re-liquefies the growing crystal. Preferably multiple zone heaters are spaced from each other along the growing crystal for sequentially liquefying the growing crystal. Preferably the first zone heater further includes heating and purifying apparatus for purifying the crystal melt. A preferred first zone heater includes a reactive gas distributor for distributing reactive gas from near a bottom of the crystal melt.

A liquid or solid adaptive substance source releases liquid or solid reactive substance into the melt.

A source of dopant is connected to the last zone heater for supplying dopant into the crystal melt.

In one embodiment the support is a movable support for moving the liquid crystal along zone heaters. Alternatively, the zone heaters move along the crystal.

One crystal growth embodiment has a chamber for holding a crystal melt. A crystal support holds a crystal movable with respect to the chamber for forming a bottom of the chamber with the crystal. A first heater adjacent the chamber heats and maintains a crystal melt within the chamber. A baffle is connected to the first heater adjacent a bottom of the chamber. A second heater is connected to the baffle beyond the first heater. A source of reactive gas feeds a gas tube connected to a controller. A distributor is connected to the gas tube and is mounted in the chamber for positioning within the crystal melt. A gas releaser connected to the distributor releases reactive gas into the crystal melt. A gas exhaust is connected to the chamber exhausts gas from the chamber above the crystal melt. An inlet tube and a controller release reactant substance into the chamber and into the crystal melt. A dopant conduit and a dopant source provide a dopant from the source through the conduit to the chamber. The reactive substance and the reactive gas control the dopant.

These and further and other objects and features of the invention are apparent in the disclosure, which includes the above and ongoing written specification, with the claims and the drawings.

BRIEF DESCRIPTION OF THE DRAWINGS

FIG. 7 shows the use of the present purifying apparatus and process in a vertical Bridgeman crystal growth system.

FIG. 8 is a schematic representation of the heat treating and annealing of a cut crystal before use.

DETAILED DESCRIPTION OF THE PREFERRED EMBODIMENTS

Figure 1:
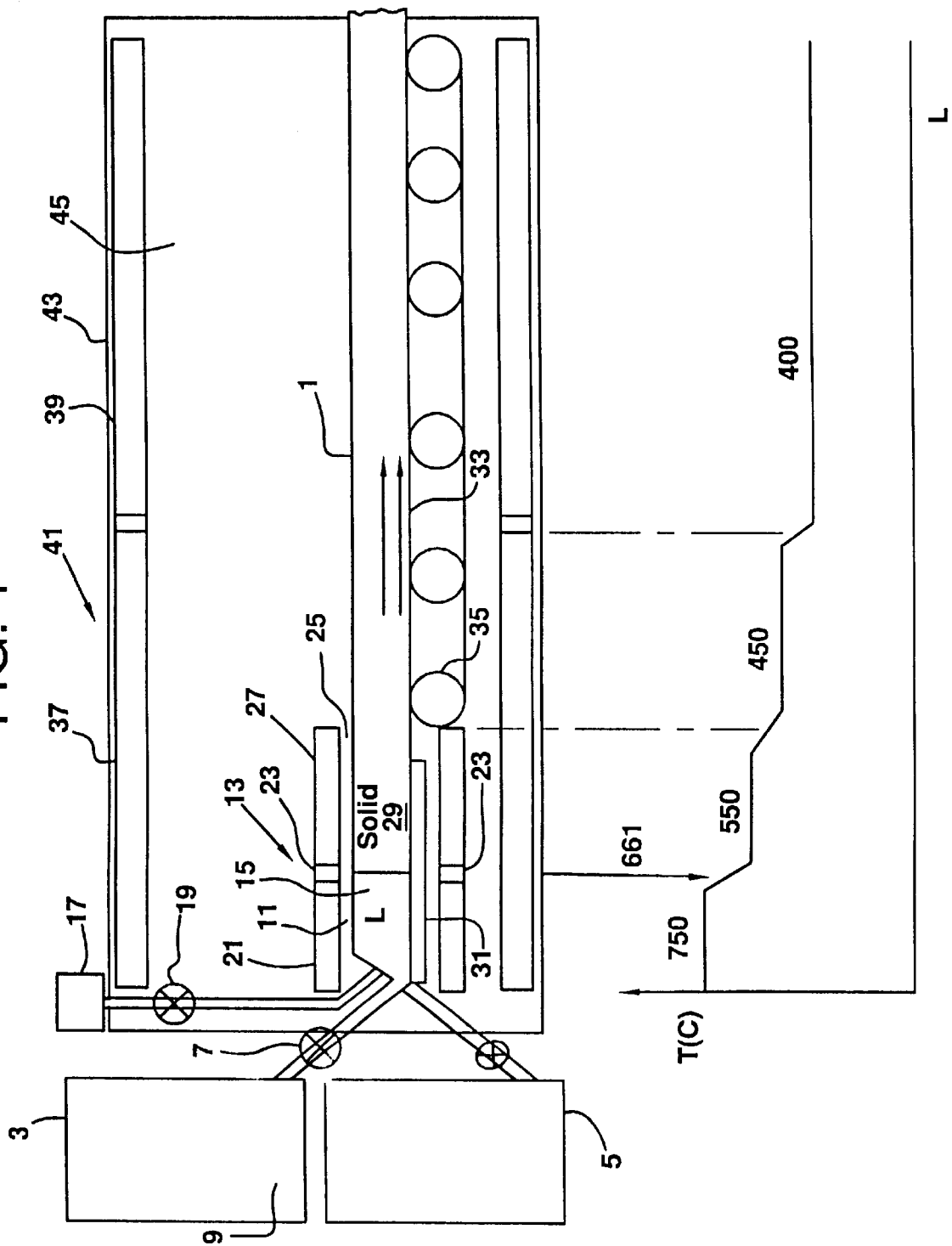
FIG. 1 shows an apparatus and process for continuous crystal plate growth.

Referring to the drawings, a crystal 1 is grown in a continuous process by first purifying a crystal source material, which is a crystal melt or powder, in a purification station 3, as later will be described. A second purification station 5 may be provided so that the crystal melt or powder may be prepared in a batch process within alternating stations, which may number several stations.

Valves 7 control the flow of purified crystal melt or purified crystal source powder 9 to a first hot zone 11 of a first heater 13. The first hot zone 11 has a temperature which is above the melt temperature of the crystal. A boat-shaped container holds the liquefied crystal 15.

A dopant source 17 has a controller 19 which controls the dopant added to the liquefied crystal 15.

The first heater 21 surrounding the first hot zone 11 produces a heat above the melting temperature of the crystal. A baffle 23 next to the first heater separates the first heat zone 11 from the second heat zone 25. The second heater 27 which surrounds the second zone produces a temperature in the second zone which is below the melt temperature of the crystal, so that a crystal solid interface 29 exists in the vicinity of the baffle between the liquefied crystal 15 and the formed crystal 1. The liquefied crystal, the liquid solid interface and the first portion of the crystal are supported in a boat-shaped crucible container with a bottom 31 and side walls which support the crystal. As the crystal leaves the support plate 31 it passes on to a conveyor 33 with supporting rollers 35, which continually move the crystal away from the first heater. The crystal moves within an enclosure 43, which has a noble gas or noble gas and reactant gas atmosphere 45.

A large heater has a first zone 37 which heats the initial part of the crystal apparatus to a temperature below the melt temperature, and a second zone 39 which maintains the crystal at a lower temperature.

A purified and doped crystal emerges from the enclosure.

In one example, as shown in the chart at the bottom of FIG. 1, when using the continuous crystal growth apparatus and process to grow a doped sodium iodide crystal, the first hot zone is maintained at about 700° C. The temperature at the baffle is maintained at the melting point of the material, which in the case of the sodium iodide crystal is about 661° C., or cesium iodide about 621° C. The second zone of the first heater maintains a temperature of about 550° C., or below the temperature of melting. The larger heater 41 has two zones 37 and 39, which provide heat below the temperature of zone 25, or at about 450° C. and about 400° C. respectively, so that the crystal uniformly cools as it proceeds.

Figure 2:
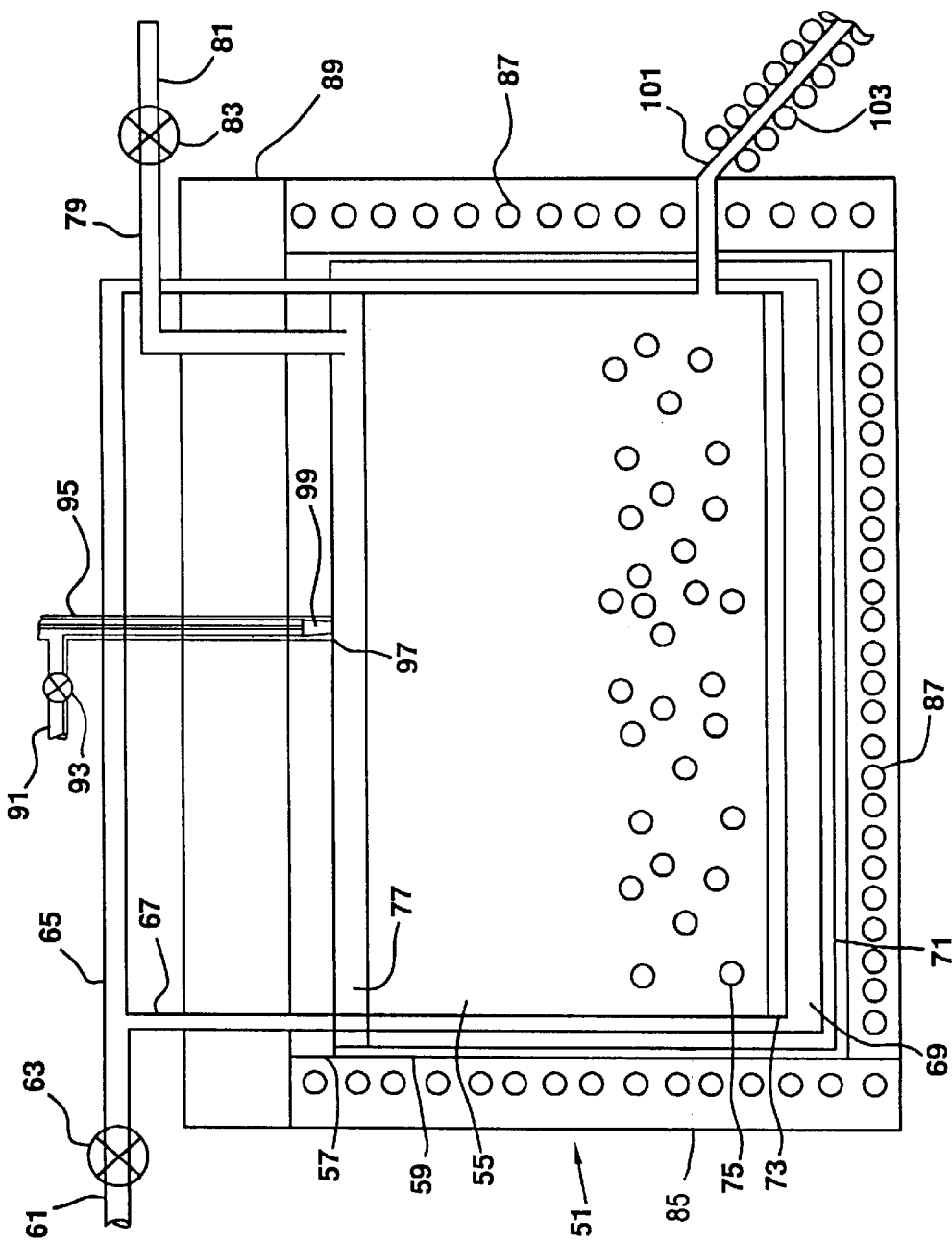
FIG. 2 shows a chamber for purifying crystal material and liquid or solid scavengers. The crystal material may be a starter powder or a crystal melt. The purifier in FIG. 2 may be used to supply the continuous crystal plate growth apparatus and process shown in FIG. 1.

As shown in FIG. 2, a crystal purifying apparatus and process is generally referred to by the numeral 51. The apparatus has a chamber 53, which is preferably a quartz chamber, for holding a crystal melt 55, or alternatively for holding crystal-forming powder used to create a crystal melt. The chamber has a lid 57, which may be a quartz lid, which tightly seals with upper edges of the walls 59 of the chamber 53. A reactive gas source 61 is controlled by a valve 63, which supplies reactant gas to a pipe 65. Tubes 67 conduct the reactant gas to a distributor 69 at or near the bottom 71 of the chamber 53. As shown in FIG. 2, the distributor may be a plenum. Gas is released from the plenum through a gas release plate 73, which in this case may be a porous quartz plate. Positive reactant gas pressure is maintained within the plenum 69 so that the gas flows upward through the port plate 73. A suitable reactant gas, for example, may be bromine mixed with argon or helium or a noble gas. The entire gas mixture is called the reactant gas, although only the bromine may be actually reactant. Bromine, for example, may form gaseous bromides which are removed as gases from the melt or powder 55.

The flow of gas through the melt or powder is represented by the gas pockets or bubbles 75, which move upward. The flow of gas also entrains any water in the crystal material and carries the water from the heated crystal material as gaseous water vapors which are removed from the space 77 at the top of the chamber through a reduced pressure line 79 or vacuum line, which is connected to a source of reduced pressure or a vacuum 81, as controlled by a valve 83. The vacuum line 79 withdraws water vapor and reacted gas products. Solid impurities fall to the bottom of the material 55 when the material is in melt, and light solid impurities migrate upward to float on the top of the melt. Heaters, generally indicated by the numeral 85, surround the chamber.

The heaters 85 heat the powder material or maintain the high temperature necessary for melting and maintaining the melt 55. At the top of the heaters a large insulating block 89 is placed to maintain the uniform temperature within the apparatus.

A source 91 of liquid or solid reactant substance is controlled by a controller 93 for supply to a conduit 95, which extends through the insulation 89 and lid 57 to an opening 97, which is controlled by a removable plug 99, so that the appropriate scavenging liquid or solid may be added to the melt 55.

The purified liquid or powder is removed through an outlet 101 in a side wall of the chamber 53 slightly above the bottom.

A shut-off valve is used in the supply line 101. The shutoff valve may be a mechanical valve or an electromechanical solenoid operated valve, or a thermally operated valve 103, such as shown in FIG. 2. The thermally operated valve is a series of cooling and heating coils which freeze or melt the crystal and allow flow of liquid crystal through the conduit 101.

Figure 3:
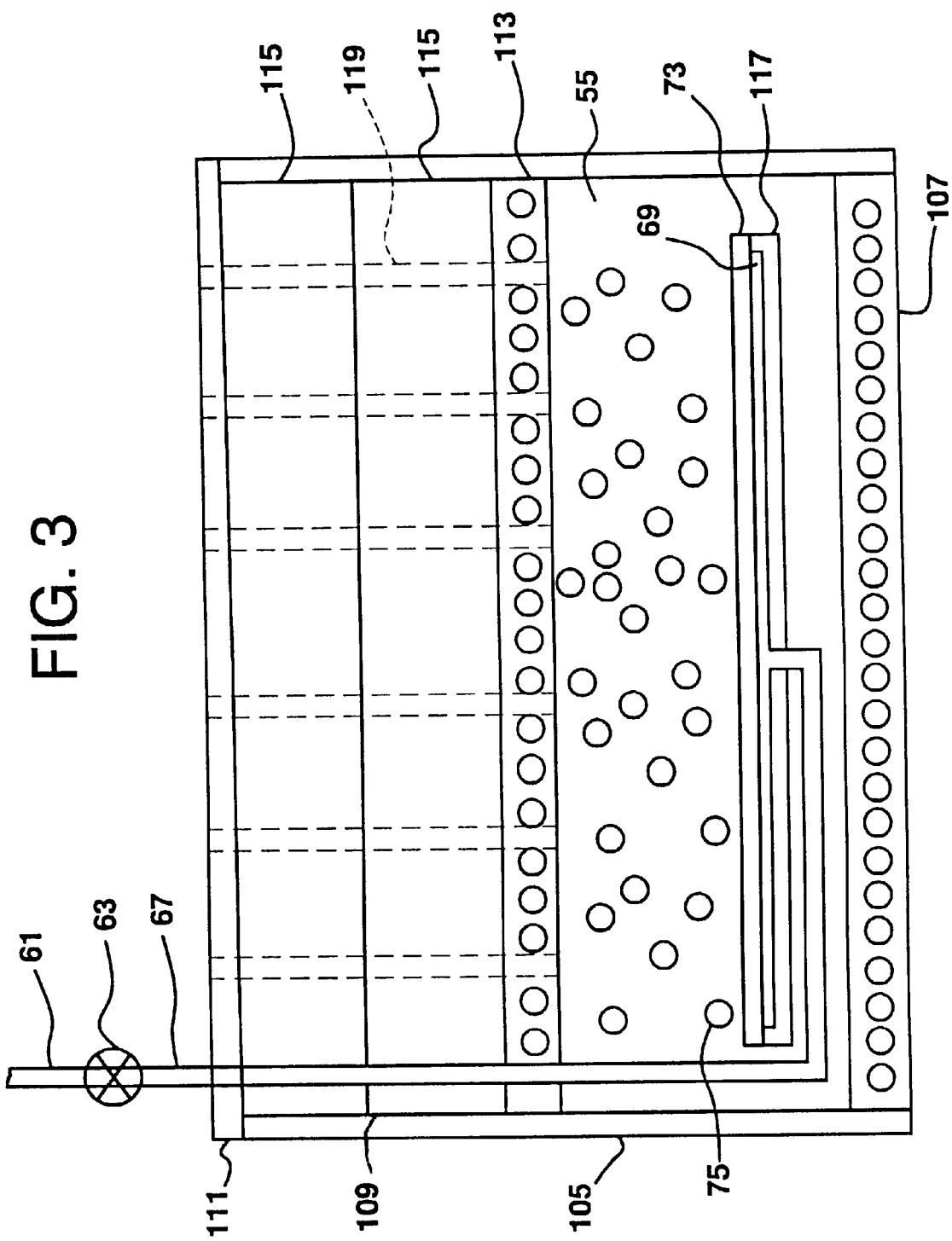
FIG. 3 shows a crystal melt purifier for use in a continuous crystal plate growth apparatus and process, such as shown in FIG. 1.

FIG. 3 shows an alternate heating and purifying apparatus and process in which a crystal melt 55 is held between side walls 105 and the base 107 of a casing 109, which has a cover 111. An upper heater 113 encloses the crystal melt. Insulation layers 115 above the upper heater 113 concentrate and reduce outward flow of the heat.

Reactant gas from a source 61 is admitted through a control valve 33 to a reactant gas tube 67, and from there into a distributor plenum 69 within a distributor housing 117. A porous quartz plate 73 covers the distributor and releases gas in the form of bubbles 75 through the melt 55.

Gaseous reactant products and water vapor escape through small openings 119, which extend through the heater 113, the insulation 115 and the cover 111. Large openings 119 may be supplied for the addition of liquid or solid reactant substances or dopants.

Figure 4:
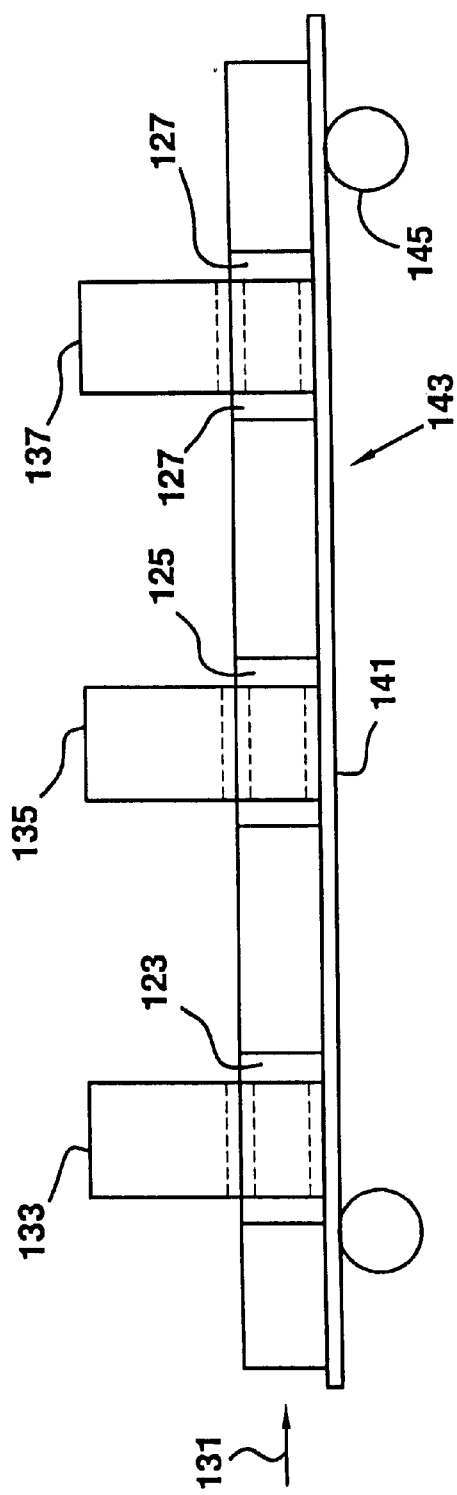
FIG. 4 shows a continuous crystal plate growth apparatus and process using multiple zone heating and purifying.

FIG. 4 shows a multiple heater arrangement 121 for zone heating and liquefaction 123, 125 and 127 as the crystal 1 moves in the direction 131 with respect to the zone heaters 133, 135 and 137. The sequential melting of the crystal further purifies the crystal. In the final melting operation, such as in heating and purifying apparatus 137, the dopant is added to the crystal.

Figure 5:
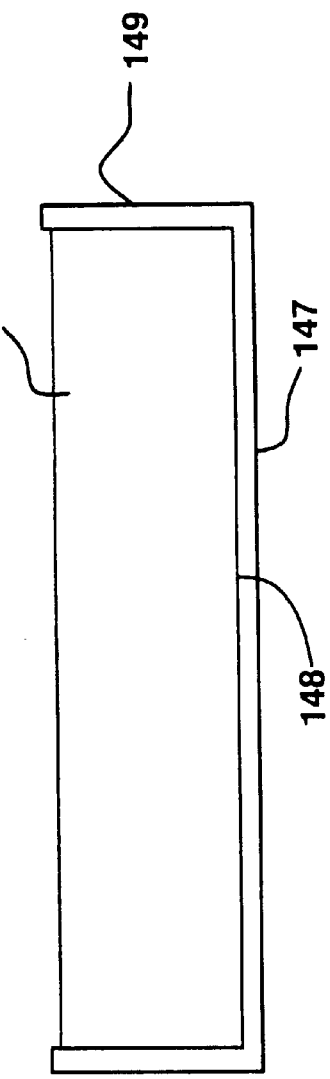
FIG. 5 is a detail of sides of the crystal growth apparatus in the melt zones.

The crystal may move through the assembly of heating and purifying apparatus such as on a support 141, which is part of a conveyor 143 supported by rollers schematically indicated at 145. Preferably, as shown in FIG. 5, in the areas of the melt zones 123, 125 and 127, the liquefied crystal is supported within a boat-shaped trough 147 with a base 148 and side walls 149, which are formed of quartz or ceramic. As the molten material solidifies and crystallizes, the individual crystal portions may be picked up by conveyors, or the entire crystal 1 may move along a rigid and smooth quartz or ceramic surface of a support 141.

Alternatively, the heating and purifying assemblies 133, 135 and 137 may be constructed for movement along a stationary crystal.

Figure 6:
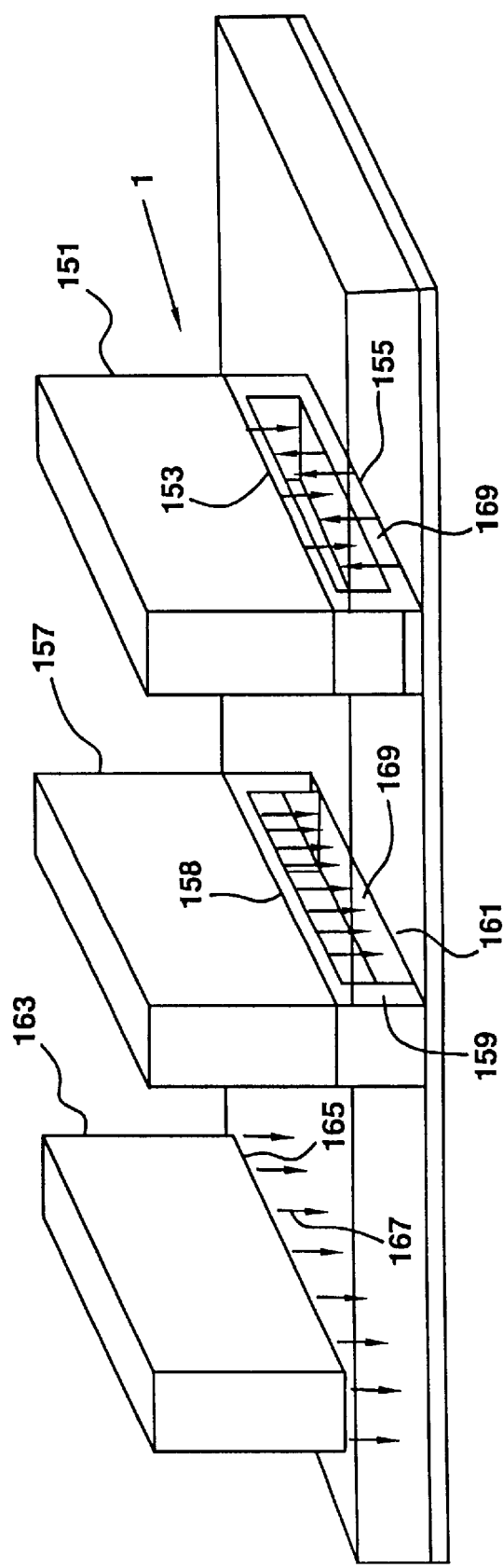
FIG. 6 shows varied heaters for use in the continuous heat crystal growth process.

FIG. 6 shows three configurations of heating and purifying apparatus shown melting and purifying a crystal. The heaters may be used sequentially as different heaters, or each of the heaters in a sequence may be identical. Heating element 151 has an upper heater 153 and a lower heater 155, which melt the crystal 1 as it flows between the heating elements. The heating and purifying apparatus 157 has an upper heater 158 and side heaters 159. The bottom 161 may be opened so that the crystal or heater may move and so that the melted crystal may be uniformly supported through the heating area. Alternatively, the heating elements may extend entirely around the liquid crystal area.

Heater 163 radiates heat downward from a thermal radiator 165, such as a quartz heating element or a wide laser beam, or a series of laser beams, or simply a strong standard heater. The heat flux 167 heats and melts the crystal material.

As shown in heating and purifying elements 151 and 157, the height of the heater openings may be equal or larger than the melt thickness. Alternatively, the opening 169 may be smaller than the melt thickness so that the crystal moves faster through the melt zone than through the approach. In one example, such as when melting and purifying a sodium iodide crystal in multiple melting zones, the crystal may move at a speed of slightly less than one foot per day.

As shown in the FIG. 7, the present purifying apparatus and process may be used in a standard Bridgeman crystal growth apparatus 171. An upper heater 173 heats a zone 175 around melt chamber 177 to a temperature above the melting temperature. A baffle below heater 173 separates heat zone 175 from heat zone 179, in which heat from a heater 181 is below the melting temperature of the crystal. A liquid-solid interface 183 of the crystal occurs at about the position of the baffle 185. Reactant purifying gas is admitted to the melt 187 through a source 61 and a control 63, and a tube 65 leading to a distributor 69, which releases reactant gas through a porous plate into the crystal melt 187. Gasified impurities are removed through vacuum line 179, as controlled by valve 83 to a source of reduced pressure 81. The crystal 191 is contained in a platinum or quartz crucible 193.

As shown in FIG. 8, the final product, which is a crystal 201 which has been cut from the long crystal plate, is placed in a support 203 on a substrate 205, and sides and end surfaces are covered by plates 207 and a cover 209 is placed over the crystal. All of the entire system is enclosed. The entire system is enclosed in a crystal furnace 211 that provides the necessary temperature for the heat treating an annealing process while force is applied to the crystal 201 through the cover and walls 209 and 207.

While the invention has been described with reference to specific embodiments, modifications and variations of the invention may be constructed without departing from the scope of the invention, which is defined in the following claims.

I claim:

1. A heating apparatus comprising a platform for supporting a formed and cut crystal and sides for enclosing sides of the crystal, a lid positioned over the platform such that the platform, lid and sides apply inward force to press the crystal inward, and at least one heater for heating the crystal while the crystal is under pressure from the platform lid and sides for annealing the crystal.

2. The apparatus of claim 1, wherein the sides have inner walls having shapes adapted for application of an even force per unit area to irregular bodies being subjected to the pressure or pressure/temperature treatment.

3. The apparatus of claim 1, wherein the sides have inner walls which are flat for exerting an even force on the single crystal, crystal powder or polycrystalline body.

4. The apparatus of claim 1, wherein the platform is a vessel constructed for allowing processing of irregular bodies subjected to the pressure or pressure/temperature treatment.

5. The apparatus of claim 1, wherein a resultant force of the pressure on each side is different at different points.

6. The apparatus of claim 1, wherein the sides are independently movable for providing a basis for pressure or pressure temperature treatment of the single crystal, crystal powder or polycrystalline body of desired shape.

7. The apparatus of claim 6, wherein the body being treated is re-shaped for obtaining desired physical parameters.

8. A heating apparatus comprising a platform for supporting crystals and sides for enclosing sides of the crystals, a lid positioned over the platform such that the platform, lid and sides apply inward force to press the crystals inward, and at least one heater for heating the crystals while the crystals are under pressure from the platform lid and sides for annealing the crystals.

9. The apparatus of claim 8, wherein the crystals are selected from the group consisting of crystal powders, polycrystalline materials and single crystals.

10. The apparatus of claim 8, wherein the sides have inner walls having shapes adapted for application of an even force per unit area to irregular bodies being subjected to the pressure or pressure/temperature treatment.

11. The apparatus of claim 8, wherein the sides have inner walls which are flat for exerting an even force on the single crystal, crystal powder or polycrystalline body.

12. The apparatus of claim 8, wherein the platform is a vessel constructed for allowing processing of irregular bodies subjected to the pressure or pressure/temperature treatment.

13. The apparatus of claim 8, wherein a resultant force of the pressure on each side is different at different points.

14. The apparatus of claim 8, wherein the sides are independently movable for providing a basis for pressure or pressure temperature treatment of the single crystal, crystal powder or polycrystalline body of desired shape.

15. A heating process, comprising providing a platform for supporting a formed and cut crystal, providing sides for enclosing sides of the crystal, providing a lid positioned over the platform, applying inward force to press the crystal inward with the platform, lid and sides, providing at least one heater, heating the crystal while the crystal is under pressure from the platform, lid and sides, and annealing the crystal.

16. The process of claim 15, further comprising providing the sides with inner walls having shapes adapted for application of an even force per unit area and subjecting irregular bodies to the force and heating.

17. The process of claim 15, further comprising providing the sides with inner walls which are flat, and wherein the applying inward force comprises exerting an even force on the single crystal, crystal powder or polycrystalline body.

18. The process of claim 15, wherein the platform is a vessel constructed for allowing treating of irregular bodies subjected to the force or force and heating.

19. The process of claim 15, wherein a resultant force of the pressure on each side is different at different points.

20. The process of claim 15, wherein the sides are independently movable for providing a basis for pressure or pressure temperature treatment of the single crystal, crystal powder or polycrystalline body of desired shape.

21. The process of claim 15, wherein the body being treated is re-shaped for obtaining desired physical parameters.

22. A crystal heating process, comprising providing a platform for supporting crystals and providing sides for enclosing sides of the crystals, providing a lid positioned over the platform, applying inward force with the platform, lid and sides for pressing the crystals inward, providing at least one heater, heating the crystals while the crystals are under pressure from the platform lid and sides, and annealing the crystals.

23. The process of claim 22, wherein the crystals are selected from the group consisting of crystal powders, polycrystalline materials and single crystals.

24. The process of claim 22, wherein the sides have inner walls having shapes adapted for application of an even force per unit area to irregular bodies being subjected to the force or force and heating.

25. The process of claim 22, wherein the sides have inner walls which are flat for exerting an even force on single crystals, crystal powder or polycrystalline body.

26. The process of claim 22, wherein the platform is a vessel constructed for allowing processing of irregular bodies subjected to the force or force and heating.

27. The process of claim 22, wherein a resultant force of the force on each side is different at different points.

28. The process of claim 22, wherein the sides are independently movable for providing a basis for pressure or pressure and temperature treatment of the single crystal, crystal powder or polycrystalline body of desired shape.

* * * * *